United States Patent
Matsumoto et al.

(10) Patent No.: US 7,132,124 B2
(45) Date of Patent: Nov. 7, 2006

(54) DIE FOR MOLDING HONEYCOMB STRUCTURE AND MANUFACTURING METHOD THEREOF

(75) Inventors: Keiji Matsumoto, Nagoya (JP); Haremi Ito, Tokoname (JP); Shinji Murahata, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 63 days.

(21) Appl. No.: 10/250,572

(22) PCT Filed: Oct. 22, 2002

(86) PCT No.: PCT/JP02/10959

§ 371 (c)(1),
(2), (4) Date: Jul. 3, 2003

(87) PCT Pub. No.: WO03/039827

PCT Pub. Date: May 15, 2003

(65) Prior Publication Data

US 2004/0076707 A1    Apr. 22, 2004

(30) Foreign Application Priority Data

Nov. 5, 2001    (JP) .............................. 2001-338839

(51) Int. Cl.
*B29C 47/12*    (2006.01)
(52) U.S. Cl. .................. 427/135; 249/134; 425/461; 425/467; 425/380; 427/437; 427/438
(58) Field of Classification Search ............ 425/380, 425/461, 467; 264/177.12; 427/135, 437, 427/438; 249/114.1, 134
See application file for complete search history.

(56) References Cited

U.S. PATENT DOCUMENTS

| | | | | |
|---|---|---|---|---|
| 4,861,626 A | * | 8/1989 | Ihara et al. | 427/133 |
| 5,070,588 A | * | 12/1991 | Miwa et al. | 76/107.1 |
| 5,205,903 A | | 4/1993 | Suzuki et al. | 216/75 |
| 5,876,804 A | * | 3/1999 | Kodama et al. | 427/436 |
| 6,193,497 B1 | | 2/2001 | Suzuki | 425/380 |

FOREIGN PATENT DOCUMENTS

| | | |
|---|---|---|
| JP | A 60-106972 | 6/1985 |
| JP | A 60-145804 | 8/1985 |
| JP | A 61-39167 | 2/1986 |
| JP | A 61-69968 | 4/1986 |
| JP | A 63-109171 | 5/1988 |
| JP | A 4-146624 | 5/1992 |
| JP | A 10-309713 | 11/1998 |
| JP | 2000-169970 | 6/2000 |

* cited by examiner

*Primary Examiner*—Joseph S. Del Sole
(74) *Attorney, Agent, or Firm*—Oliff & Berridge, PLC

(57) ABSTRACT

In a die for molding a honeycomb structure, in which a coating layer is formed on a die base so that slits with a particular width are provided, the slits are provided so as to have a width of 30 to 200 μm by forming the coating layer by a substrate layer with a thickness of 10 to 100 μm and a surface layer with a thickness of 1 to 30 μm. Further, the substrate layer is formed by a metal layer containing no oxide.

A thin-wall honeycomb structure with a wall thickness of 30 to 200 μm can be formed, and moreover a die for molding a honeycomb structure, in which the coating layer is not damaged and thus the durability is high, and a manufacturing method thereof can be provided.

14 Claims, 1 Drawing Sheet

DIE FOR MOLDING HONEYCOMB STRUCTURE AND MANUFACTURING METHOD THEREOF

TECHNICAL FIELD

The present invention relates to a die used when a honeycomb structure is extrusion molded and a manufacturing method thereof and, more particularly, to a die for molding a honeycomb structure, in which a coating layer is formed on a die base so that slits having a particular width are provided, and a manufacturing method thereof.

BACKGROUND ART

Conventionally, a ceramic honeycomb structure has been used widely as an exhaust gas purifying filter, a catalyst carrier, and the like. In recent years, as the regulation of exhaust gas has been tightened, a honeycomb structure having a wall thickness of 120 µm or smaller, which can offer higher exhaust gas purifying performance, has been demanded strongly.

On the other hand, as a manufacturing method for such a honeycomb structure, an extrusion molding method has generally been used. When extrusion molding is performed, it is a slit width of a die that determines the wall thickness of honeycomb structure, and various dies in which a coating layer is formed on a die base to adjust the slit width have been disclosed.

Specifically, as a conventional die for molding a honeycomb structure, there has been disclosed a die in which a coating layer is formed on a die base by electroless plating to adjust the slit width, and a rounded portion having roundness is formed at a corner of face forming each slit to increase its strength (Japanese Patent Publication No. 61-39167).

Also, a die for molding a honeycomb structure, in which a coating layer consisting of iron boride, chromium carbide, aluminum oxide, titanium carbide, titanium nitride, or titanium carbide nitride is formed on a die base by chemical vapor deposition (CVD) to improve abrasion resistance, has been disclosed (Japanese Patent Laid-Open No. 60-145804).

However, in the die for molding a honeycomb structure described in Japanese Patent Publication No. 61-39167, since the coating layer is formed by electroless nickel plating, the abrasion resistance of the coating layer is not necessarily sufficient to accomplish extrusion of ceramic material.

Also, in the die described in Japanese Patent Laid-Open No. 60-145804, since the coating layer formed by chemical vapor deposition (CVD) has a thickness of about 30 µm at the most, if the coating layer is formed by chemical vapor deposition (CVD) after slits are provided roughly by a method such as electrical discharge machining (EDM), grinding, or the like, it is very difficult to finally form slits having a slit width of 120 µm or narrower, so that a honeycomb structure that meets the above-described recent demand cannot be obtained.

The applicant of the present invention has proposed a die for molding a honeycomb structure, in which a substrate layer is formed by electroless plating to roughly adjust the slit width, and then a surface layer is formed by chemical vapor deposition (CVD), by which slits having a slit width of 30 to 200 µm are provided (Japanese Patent Laid-Open No. 10-309713).

However, according to the subsequent study conducted by the inventor, it was found that in this die for molding a honeycomb structure, when or after the surface layer is formed by chemical vapor deposition (CVD), the substrate layer easily peels off, which sometimes results in damage to the surface layer.

DISCLOSURE OF THE INVENTION

The inventor conducted studies earnestly to solve the above-described problems with prior arts. As a result, in the conventional die described in Japanese Patent Laid-Open No. 10-309713, when the formation of substrate layer was divided into a plurality of steps, and the thickness of layer was checked each time a layer was formed in each step for the purpose of controlling the layer thickness, we obtained a knowledge that an oxide layer was formed on the surface of layer obtained in each step by the contact with air, and a peeling phenomenon was caused by thermal stress at the interface between this oxide layer and a metal layer containing no oxide. Then, the inventor found that the above-described problems with prior arts could be solved by preventing the formation of this oxide layer or by removing the formed oxide layer.

According to the present invention, there is provided a die for molding a honeycomb structure, which comprises: a die base, and a coating layer formed on the die base, wherein slits with a particular width are provided, characterized in that said slits are provided so as to have a width of 30 to 200 µm by forming said coating layer by a substrate layer with a thickness of 10 to 100 µm and a surface layer with a thickness of 1 to 30 µm, and further, said substrate layer is formed by a metal layer containing no oxide.

In the present invention, the substrate layer is preferably formed of at least one kind selected from a group consisting of nickel, cobalt, and copper, and the surface layer is preferably formed of at least one kind selected from a group consisting of W, WC, $W_2C$, and $W_3C$, or at least one kind selected from a group consisting of TiN, TiC, and TiCN.

On the other hand, according to the present invention, there is provided a manufacturing method for a die for molding a honeycomb structure, which comprises: forming a substrate layer with a thickness of 10 to 100 µm on a die base having puddle introduction holes and slits communicating with said puddle introduction holes by a step including electroless plating, and then forming a surface layer with a thickness of 1 to 30 µm by chemical vapor deposition (CVD), characterized in that said step including electroless plating is a step without the formation of an oxide layer.

In the above-described manufacturing method, the substrate layer is preferably formed of at least one kind selected from a group consisting of nickel, cobalt, and copper, and the surface layer is preferably formed of at least one kind selected from a group consisting of W, WC, $W_2C$, and $W_3C$, or at least one kind selected from a group consisting of TiN, TiC, and TiCN.

As the step without the formation of an oxide layer in the present invention, there can be cited a step in which the substrate layer is formed by electroless plating of one continuous cycle; a step in which the substrate layer is formed by electroless plating, and subsequently the substrate layer is further formed by electroplating; a step in which the substrate layer is formed while the slit width in a state in which the substrate layer is formed on the die base is measured in an electroless plating solution; a step in which the substrate layer is formed by electroless plating in an inert gas atmosphere; a step in which pickling is performed after the substrate layer is formed by electroless plating; or the like steps. These steps can be performed singly or combinedly.

When the substrate layer is formed by electroless plating of one continuous cycle, the formation of substrate layer is preferably accomplished while a dummy piece which is formed of the same material as that of the die base and is formed with slits with the same width is dipped in a plating bath and the slit width of the dummy piece is controlled. Also, when the pickling step is performed, pickling is preferably performed in an inert gas atmosphere.

As described above, in the die for molding a honeycomb structure in accordance with the present invention, the slit formed relatively roughly by electrical discharge machining, grinding, etc. is narrowed to a range that can be controlled by the surface layer by the formation of the substrate layer with a thickness of 10 to 100 µm accomplished by electroless plating.

In the die for molding a honeycomb structure in accordance with the present invention, the surface layer with a thickness of 1 to 30 µm which has high abrasion resistance is formed by chemical vapor deposition (CVD) that can control the thickness at a 1 µm level, and thus slits with a slit width of 30 to 200 µm are provided. Therefore, according to the die for molding a honeycomb structure in accordance with the present invention, a thin-wall honeycomb structure with a wall thickness of 30 to 200 µm can be manufactured.

Moreover, in the die for molding a honeycomb structure in accordance with the present invention, since the substrate layer is a uniform layer including no oxide layer, a die for molding a honeycomb structure in which peeling of substrate layer and in turn breakage of surface layer does not occur even if a large change in temperature occurs when the surface layer is formed or when the honeycomb structure is used, and thus the durability is high can be manufactured.

BRIEF DESCRIPTION OF THE DRAWINGS

FIG. 1(*b*) is a partially enlarged view of FIG. 1(*a*);

FIG. 1(*c*) is an enlarged view of a portion of the substrate layer of FIG. 1(*b*)

BEST MODE FOR CARRYING OUT THE INVENTION

The present invention will now be described in detail with reference to the accompanying drawings.

Figure 1A:
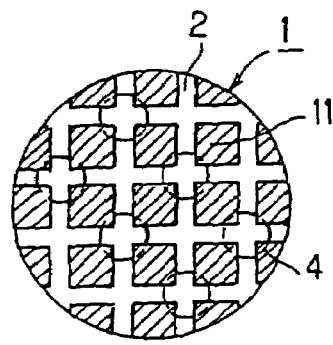
FIG. 1(*a*) is a sectional view schematically showing one embodiment of a die for molding a honeycomb structure in accordance with the present invention.
Figure 1B:
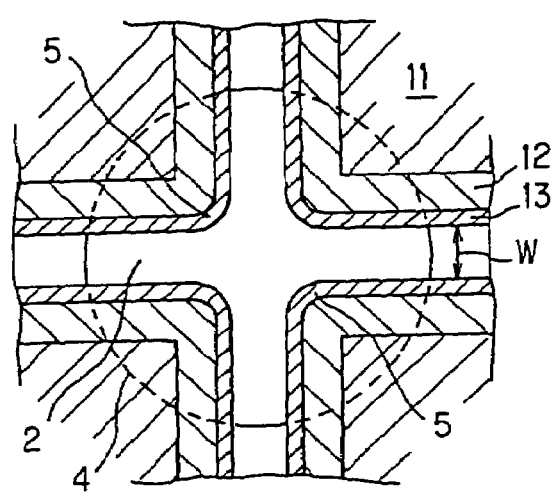
Figure 1C:
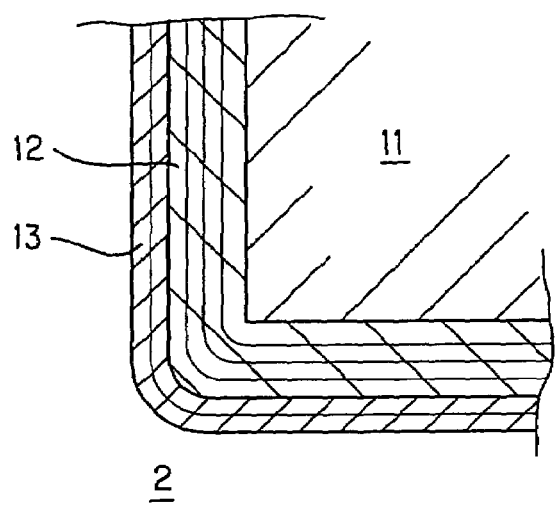
Figure 2:
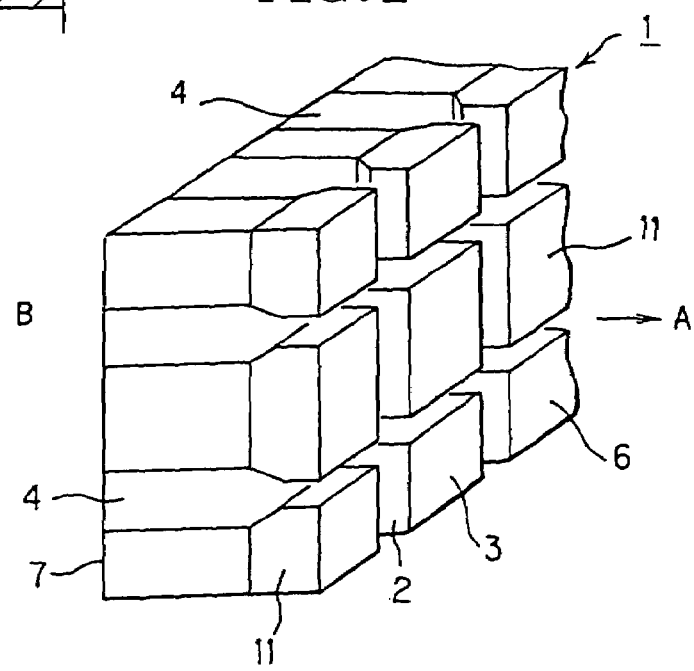
FIG. 2 is a partially enlarged view schematically showing one example of a slit and a puddle introduction hole in a die for molding a honeycomb structure in accordance with the present invention.

FIG. 1(*a*) is a sectional view showing one embodiment of a die for molding a honeycomb structure in accordance with the present invention, and FIG. 1(*b*) is a partially enlarged view of FIG. 1(*a*). FIG. 2 is a partially enlarged view schematically showing one example of a slit and a puddle introduction hole in a die for molding a honeycomb structure in accordance with the present invention.

As shown in FIG. 2, a die 1 for molding a honeycomb structure (hereinafter, sometimes referred to simply as "die 1") is usually provided with puddle introduction holes 4 in a surface 7 on the side B opposite to the compact extrusion side A, and in a surface 6 on the compact extrusion side A is provided slits 2 that are formed into, for example, a lattice shape etc. so as to communicate with the puddle introduction holes 4. Usually, the puddle introduction hole 4 is provided so as to correspond to a position at which the slits 2 intersect. Puddle obtained by kneading a ceramic raw material etc. is introduced into the die 1 through the puddle introduction holes 4, and a compact of honeycomb structure is extruded through the slits 2.

The present invention is characterized in that in such a die, as shown in FIG. 1, a coating layer consisting of a substrate layer 12 with a thickness of 10 to 100 µm and a surface layer 13 with a thickness of 1 to 30 µm is formed on a die base 11, by which slits 2 with a slit width W of 30 to 200 µm are provided, and further the substrate layer 12 is formed by a metal layer containing no oxide.

Thereby, a thin-wall honeycomb structure having a wall thickness of 30 to 200 µm can be manufactured, and also damage to the surface layer 13 due to peeling of the substrate layer 12 is not caused, so that an extremely durable die 1 can be obtained.

The surface layer 13 in the present invention is preferably formed of at least one kind selected from a group consisting of W, WC, $W_2C$, and $W_3C$, or at least one kind selected from a group consisting of TiN, TiC, and TiCN in terms of high hardness and high abrasion resistance.

Among these compounds, TiCN is further preferable because of its higher hardness and higher abrasion resistance. Also, the surface layer 13 formed of $W_2C$ or $W_3C$ is further preferable because the treatment temperature at the time when the surface layer is formed is low, the surface layer can be formed easily, the surface is smooth, and the puddle extrusion resistance is low.

The substrate layer in the present invention is preferably formed of at least one kind selected from a group consisting of nickel, cobalt, and copper in terms of high bonding strength with the surface layer formed of $W_2C$ or $W_3C$, and among these elements, the substrate layer formed of nickel is further preferable.

In the present invention, the above-described substrate layer 12 and surface layer 13 can be formed of a plurality of different layers, respectively, as shown in FIG. 1(*c*).

In the present invention, in order to increase the strength of the thin-wall honeycomb structure whose strength is liable to be low, a corner portion 5 of the die 1, which is formed in a portion in which the slits 2 intersect, preferably has a rounded shape having roundness. In this regard, the radius of curvature of the rounded shape is not specially restricted, and the rounded shape may have a natural roundness.

Next, a manufacturing method for such a die in accordance with the present invention will be described.

In the present invention, first, slits which are slightly wider than a desired slit width W are formed in the die base by EDM and/or grinding or the like method. At this time, the slits may be formed into a desired shape, for example, a lattice shape etc. in predetermined numbers at predetermined intervals.

The puddle introduction holes communicating with the slits are preferably formed, for example, so as to be open on the surface opposite to the surface on which the slits of the die base are formed and to correspond to positions of slit intersection. At this time, the width of slit can have an accuracy obtained by EDM, grinding, etc., and is preferably in the range of 150 to 300 µm.

Next, in the present invention, the substrate layer with a thickness of 10 to 100 µm which is formed of a metal is laminated so that a range that can be controlled easily by chemical vapor deposition (CVD), described later, is provided.

The formation of substrate layer in the present invention is accomplished by a step including electroless plating that can easily form a relatively thick layer, and moreover, this step including electroless plating is accomplished as a step without the formation of an oxide layer.

As the step without the formation of an oxide layer, there can be cited (1) a step in which the substrate layer is formed by electroless plating of one continuous cycle, (2) a step in which the substrate layer is formed by electroless plating in an inert gas atmosphere, (3) a step in which the substrate layer is formed while the slit width in a state in which the substrate layer is formed on the die base is measured in a electroless plating solution, (4) a step in which the substrate layer is formed by electroless plating, and subsequently the substrate layer is further formed by electroplating, (5) a step in which the substrate layer is formed by electroless plating, and subsequently the surface of substrate layer is pickled with dilute nitric acid, acetic acid, etc., or the like steps. These steps can be performed singly or combinedly.

In the present invention, the step (1) or (4) of these steps is preferably included because the oxide layer can be prevented from being formed or can be removed surely. It is especially preferable that the step (4) be included because the adhesion of substrate layer is improved by nucleation of nickel crystals etc.

The reason why an effect of removing an oxide layer is great when the substrate layer is formed by electroplating in the step (4) is not necessarily definite, but the reason is presumably that in addition to a great etching effect of electrolyte, a pure metal such as pure nickel used in electroplating is difficult to oxidize.

When the substrate layer is formed by the step (1), in order to easily control the thickness of substrate layer, it is preferable that a dummy piece formed with slits with the same width as slit width of the die base on which the substrate layer is to be formed be dipped in the plating bath, and the substrate layer be formed while the slit width of the dummy piece is controlled. At this time, the dummy piece is preferably formed of the same material as that of the die base, and it is preferable that a plurality of dummy pieces be dipped and taken out one after another with time to control the slit width of the dummy piece.

When pickling is performed in the step (5), in order to surely prevent the formation of oxide layer in the substrate layer, pickling is preferably performed in an inert gas atmosphere.

In the present invention, since the substrate layer 12 is formed by electroless plating, the corner portion of the die, which is formed in a portion in which the slits intersect, can be made in a rounded shape having a natural roundness, so that the strength of honeycomb structure molded using the die can be increased. The rounded shape in each portion can be adjusted so as to have an arbitrary radius of curvature by changing the concentration of electrolyte, the plating material, and the like.

The substrate layer in the present invention is preferably formed of at least one kind selected from a group consisting of nickel, cobalt, and copper in terms of high bonding strength with the surface layer as described later, and among these elements, the substrate layer formed of nickel is further preferable. Electroless plating has only to be performed by the usually used method. For example, a plating solution containing these metals and a reducing agent such as sodium hypophosphite or sodium borohydroxide is heated to about 90 to 100° C., and the die base is dipped in the plating solution for a predetermined time, whereby electroless plating can be performed.

Next, in the present invention, a desired surface layer with a thickness of 1 to 30 µm is formed on the above-described substrate layer, and thus desired slits with a slit width of 30 to 200 µm are provided.

In the present invention, the surface layer is formed by chemical vapor deposition (CVD) in which the layer thickness can be controlled accurately and the thickness can be made uniform. At this time, the method of chemical vapor deposition (CVD) is not specially restricted, and the generally used method can be applied.

The surface layer is preferably formed of at least on kind selected from a group consisting of W, WC, $W_2C$, and $W_3C$, or at least one kind selected from a group consisting of TiN, TiC, and TiCN in terms of high hardness and high abrasion resistance as compared with the layer consisting of nickel etc. described as the substrate layer.

Among these compounds, TiCN is further preferable because of its higher hardness and higher abrasion resistance. Also, the surface layer formed of $W_2C$ or $W_3C$ is further preferable because the treatment temperature at the time when the surface layer is formed is low, the surface layer can be formed easily, the surface is smooth, and the puddle extrusion resistance is low.

As a gas used for vapor deposition, any gas that corresponds to the compound forming the surface layer can be selected appropriately.

In the present invention, the total thickness of the substrate layer and the surface layer is not specially restricted, and a proper thickness may be set appropriately according to the slit width at the early stage at which the slit is formed by EDM, grinding, or the like.

In the present invention, however, in order that the corner portion of die is made in a rounded shape having a suitable roundness to increase the strength of honeycomb structure, and that a coating layer whose desired properties can be obtained by the fewest possible steps is formed to reduce the cost, the total thickness of the substrate layer and the surface layer is preferably 20 to 70 µm. Also, the rounded shape can be kept by providing the surface layer with a uniform thickness on the substrate layer by chemical vapor deposition (CVD).

Next, the present invention will be described in more detail based on specific examples. The present invention is not limited to these examples.

EXAMPLE 1

First, a C-450 plate material consisting of stainless steel was fabricated into a square plate with a thickness of 15 mm and a side length of 215 mm by using a lathe and a grinding machine. In one end surface of the square plate, 226 slits with a width of 180 µm and a depth of 3.0 mm were formed at intervals of 0.94 mm by EDM and grinding. Similarly, slits that were perpendicular to the formed slits were formed. On the other hand, from the other end surface of the square plate, puddle introduction holes with a diameter of 0.70 mm and a depth of 12.3 mm were formed at intervals of 0.94 mm at the intersections of the slits (every other slit) by EDM. The number of holes were about 26,000 (226×226/2).

Next, in order to mount the square plate on a molding machine, the square plate was fabricated into a circular plate with an outside diameter of 215 mm by EDM to obtain a disk-shaped die. Then, after being degreased, this die was dipped in a 35% hydrochloric acid bath for one minute, and electroplating was accomplished in a nickel chloride acidic bath. Immediately after that, electroless plating was accomplished in a nickel phosphate bath by a plating step of one continuous cycle, by which a substrate layer with a thickness of 60 µm was formed. At this time a plurality of dummy pieces formed of the same material as that of a die base were similarly subjected to electroless plating, and during the plating step, the dummy pieces were taken out one after another with time to control the thickness of the substrate layer.

Next, a surface layer with a thickness of 10 µm which consists of $W_3C$ was formed by chemical vapor deposition (CVD) to obtain a die for molding a honeycomb structure in which the slit width W was 40 µm (180−(60+10)×2) and a corner portion formed in a portion in which the lattice-shaped slits intersect had a rounded shape with a radius curvature of 35 µm.

For the obtained die for molding a honeycomb structure, damage or flaw of coating layer such as peeling of the substrate layer was not found at all. Also, using the obtained die for molding a honeycomb structure, a honeycomb structure having a cordierite composition was extrusion molded, and the compact was dried and fired. As a result, a honeycomb structure with a wall thickness of 100 µm could be obtained without the occurrence of poor molding or other defects.

EXAMPLE 2

After being degreased, a disk-shaped die was dipped in a 35% hydrochloric acid bath for one minute, and electroplating was accomplished in a nickel chloride acidic bath. Immediately after that, electroless plating was accomplished in a nickel phosphate bath without using the dummy pieces. Thereafter, the die was taken out once from the nickel phosphate bath to check the thickness of substrate layer. Then, degreasing treatment, hydrochloric acid treatment, and electroplating using a nickel chloride acidic bath, which were similar to the pretreatment, were accomplished again. Immediately after that, electroless plating was accomplished again in a nickel phosphate bath to form a substrate layer with a thickness of 60 µm. Regarding other respects, the procedure was the same as that of example 1. By the above-described procedure, a die for molding a honeycomb structure in which the slit width W was 40 µm (180−(60+10)×2) and a corner portion formed in a portion in which the lattice-shaped slits intersect had a rounded shape with a radius curvature of 35 µm was obtained.

For the obtained die for molding a honeycomb structure, damage or flaw of coating layer such as peeling of the substrate layer was not found at all. Also, using the obtained die for molding a honeycomb structure, a honeycomb structure having a cordierite composition was extrusion molded, and the compact was dried and fired. As a result, a honeycomb structure with a wall thickness of 100 µm could be obtained without the occurrence of poor molding or other defects.

EXAMPLE 3

A die for molding a honeycomb structure in which the slit width W was 40 µm (180−(60+10)×2) and a corner portion formed in a portion in which the lattice-shaped slits intersect had a rounded shape with a radius curvature of 35 µm was obtained by the same procedure as that of example 1 except that a substrate layer with a thickness of 60 µm was formed (without the use of dummy pieces) while the slit width after the substrate layer was formed was measured in a state in which the die for molding a honeycomb structure was dipped in the nickel phosphate bath.

For the obtained die for molding a honeycomb structure, damage or flaw of coating layer such as peeling of the substrate layer was not found at all. Also, using the obtained die for molding a honeycomb structure, a honeycomb structure having a cordierite composition was extrusion molded, and the compact was dried and fired. As a result, a honeycomb structure with a wall thickness of 100 µm could be obtained without the occurrence of poor molding or other defects.

EXAMPLE 4

After being degreased, a disk-shaped die was dipped in a 35% hydrochloric acid bath for one minute, and electroplating was accomplished in a nickel chloride acidic bath. Immediately after that, electroless plating was accomplished in a nickel phosphate bath without using the dummy pieces. Thereafter, the die was taken out once from the nickel phosphate bath to check the thickness of substrate layer. Then, the die was subjected to acid treatment by being dipped in a dilute sulfuric acid bath for three minutes in a nitrogen atmosphere. Immediately after that, electroless plating was accomplished again in a nickel phosphate bath to form a substrate layer with a thickness of 60 µm. Regarding other respects, the procedure was the same as that of example 1. By the above-described procedure, a die for molding a honeycomb structure in which the slit width W was 40 µm (180−(60+10)×2) and a corner portion formed in a portion in which the lattice-shaped slits intersect had a rounded shape with a radius curvature of 35 µm was obtained.

For the obtained die for molding a honeycomb structure, damage or flaw of coating layer such as peeling of the substrate layer was not found at all. Also, using the obtained die for molding a honeycomb structure, a honeycomb structure having a cordierite composition was extrusion molded, and the compact was dried and fired. As a result, a honeycomb structure with a wall thickness of 100 µm could be obtained without the occurrence of poor molding or other defects.

EXAMPLE 5

A die for molding a honeycomb structure in which the slit width W was 40 µm (180−(60+10)×2) and a corner portion formed in a portion in which the lattice-shaped slits intersect had a rounded shape with a radius curvature of 35 µm was obtained by the same procedure as that of example 1 except that a surface layer with a thickness of 10 µm which consisted of W and $W_3C$ was formed by chemical vapor deposition (CVD).

For the obtained die for molding a honeycomb structure, damage or flaw of coating layer such as peeling of the substrate layer was not found at all. Also, using the obtained die for molding a honeycomb structure, a honeycomb structure having a cordierite composition was extrusion molded, and the compact was dried and fired. As a result, a honeycomb structure with a wall thickness of 100 µm could be obtained without the occurrence of poor molding or other defects.

COMPARATIVE EXAMPLE 1

A die for molding a honeycomb structure in which the slit width W was 40 µm (180−(60+10)×2) and a corner portion formed in a portion in which the lattice-shaped slits intersect had a rounded shape with a radius curvature of 35 µm was obtained by the same procedure as that of example 1 except that when a substrate layer with a thickness of 60 µm was formed, electroless plating was accomplished without using dummy pieces, the die was taken out five times from the nickel phosphate bath to check the thickness of substrate layer, and after the thickness of substrate layer was measured, only degreasing treatment was accomplished as pretreatment when the die was put again in the nickel phosphate bath.

For the obtained die for molding a honeycomb structure, damage to the coating layer due to peeling of substrate layer occurred, and a honeycomb structure could not be extrusion molded by using this die for molding a honeycomb structure.

INDUSTRIAL APPLICABILITY

As described above, according to the present invention, a thin-wall honeycomb structure with a wall thickness of 30 to 200 μm can be formed, and moreover a die for molding a honeycomb structure, in which the coating layer is not damaged and thus the durability is high, and a manufacturing method thereof can be provided.

The invention claimed is:

1. A manufacturing method for a die for molding a honeycomb structure, which comprises:
    forming a substrate layer with a thickness of 10 to 100 μm on a die base having puddle introduction holes and slits communicating with said puddle introduction holes by a step including electroless plating, and then
    forming a surface layer with a thickness of 1 to 30 μm by chemical vapor deposition (CVD),
    characterized in that
        said step including electroless plating is a step without the formation of an oxide layer, and
        said step without the formation of an oxide layer is a step in which said substrate layer is formed by electroless plating, and subsequently said substrate layer is further formed by electroplating.

2. The manufacturing method for a die for molding a honeycomb structure according to claim 1, wherein said substrate layer is formed of at least one material selected from a group consisting of nickel, cobalt, and copper.

3. The manufacturing method for a die for molding a honeycomb structure according to claim 1, wherein said surface layer is formed of at least one material selected from a group consisting of W, WC, $W_2C$, and $W_3C$.

4. The manufacturing method for a die for molding a honeycomb structure according to claim 1, wherein said surface layer is formed of at least one material selected from a group consisting of TiN, TiC, and TiCN.

5. The manufacturing method for a die for molding a honeycomb structure according to claim 1, wherein said step without the formation of an oxide layer is a step in which said substrate layer is formed by electroless plating of one continuous cycle.

6. The manufacturing method for a die for molding a honeycomb structure according to claim 5, wherein the step in which said substrate layer is formed by electroless plating of one continuous cycle is performed while a dummy piece which is formed of the same material as that of the die base and is formed with slits with the same width is dipped in a plating bath and the slit width of said dummy piece is controlled.

7. The manufacturing method for a die for molding a honeycomb structure according to claim 1, wherein said step including electroless plating without the formation of an oxide layer is a step in which said substrate layer is formed while the slit width is measured in an electroless plating solution in a state when the substrate layer is formed on said die base.

8. The manufacturing method for a die for molding a honeycomb structure according to claim 1, wherein said step without the formation of an oxide layer is a step in which pickling is performed after said substrate layer is formed by electroless plating.

9. The manufacturing method for a die for molding a honeycomb structure according to claim 8, wherein said pickling step is performed in an inert gas atmosphere.

10. The manufacturing method for a die for molding a honeycomb structure according to claim 1, wherein said step without the formation of an oxide layer is a step in which said substrate layer is formed by electroless plating in an inert gas atmosphere.

11. A die for molding a honeycomb structure formed by the method of manufacturing a die according to claim 1, the die comprising:
    a die base, and
    a coating layer formed on the die base,
        wherein slits with a particular width are provided, characterized in that said slits are provided so as to have a width of 30 to 200 μm by forming said coating layer by a substrate layer with a thickness of 10 to 100 μm and a surface layer with a thickness of 1 to 30 μm, and
        further, said substrate layer is formed of a plurality of different layers at least one of the plurality of different layers containing no oxide.

12. The die for molding a honeycomb structure according to claim 11, wherein said substrate layer is formed of at least one material selected from a group consisting of nickel, cobalt, and copper.

13. The die for molding a honeycomb structure according to claim 11, wherein said surface layer is formed of at least one material selected from a group consisting of W, WC, $W_2C$, and $W_3C$.

14. The die for molding a honeycomb structure according to claim 11, wherein said surface layer is formed of at least one material selected from a group consisting of TiN, TiC, and TiCN.

* * * * *